United States Patent
Ha

(10) Patent No.: US 7,486,566 B2
(45) Date of Patent: Feb. 3, 2009

(54) METHODS, APPARATUS, AND SYSTEMS FOR FLASH MEMORY BIT LINE CHARGING

(75) Inventor: Chang Wan Ha, San Ramon, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/617,502

(22) Filed: Dec. 28, 2006

(65) Prior Publication Data

US 2008/0158999 A1    Jul. 3, 2008

(51) Int. Cl.
*G11C 11/34*    (2006.01)
*G11C 16/06*    (2006.01)
(52) U.S. Cl. .................... 365/185.25; 365/185.12; 365/185.18
(58) Field of Classification Search ............ 365/185.25, 365/185.18, 185.12
See application file for complete search history.

(56) References Cited

U.S. PATENT DOCUMENTS

| 6,813,187 B2 * | 11/2004 | Lee ................. 365/185.18 |
| 6,879,520 B2 * | 4/2005 | Hosono et al. ......... 365/185.17 |
| 2008/0005416 A1 * | 1/2008 | Telecco .................. 710/62 |

* cited by examiner

*Primary Examiner*—Amir Zarabian
*Assistant Examiner*—Kretelia Graham
(74) *Attorney, Agent, or Firm*—Schwegman, Lundberg & Woessner, P.A.

(57) ABSTRACT

Various embodiments include a circuit to receive data information, a memory array including memory cells coupled to a bit line, and control circuitry to charge the bit line while the data information is received at the circuit. The control circuitry may program the data information into a selected memory cell of the memory cells after the data information is received at the circuit. Other embodiments including additional methods, apparatus, and systems are disclosed.

21 Claims, 8 Drawing Sheets

US 7,486,566 B2

METHODS, APPARATUS, AND SYSTEMS FOR FLASH MEMORY BIT LINE CHARGING

FIELD

Embodiments of this disclosure relate to semiconductor devices, including flash memory devices.

BACKGROUND

Semiconductor devices such as flash memory devices are used to store data or information. Many computers and electronic devices, for example digital audio players, digital cameras, digital recorders, and cellular phones, have flash memory devices. Flash memory devices may also be used as portable storage devices such as portable Universal Serial Bus (USB) flash drives or "thumb" drives. Flash memory devices may not need power to maintain the information stored in the device.

A flash memory device may store information in numerous memory cells. Each of the memory cells often has a metal-oxide semiconductor (MOS) transistor with two different transistor gates: a control gate and a so-called "floating" gate. The control gate may be used to control access to the memory cell. The floating gate may be the place where one or more bits of information are stored in each memory cell.

For the reasons stated below which will become apparent to those skilled in the art upon reading and understanding the present disclosure, there is a need for methods, apparatus, and systems for an improved flash memory operation.

DETAILED DESCRIPTION

Figure 1:
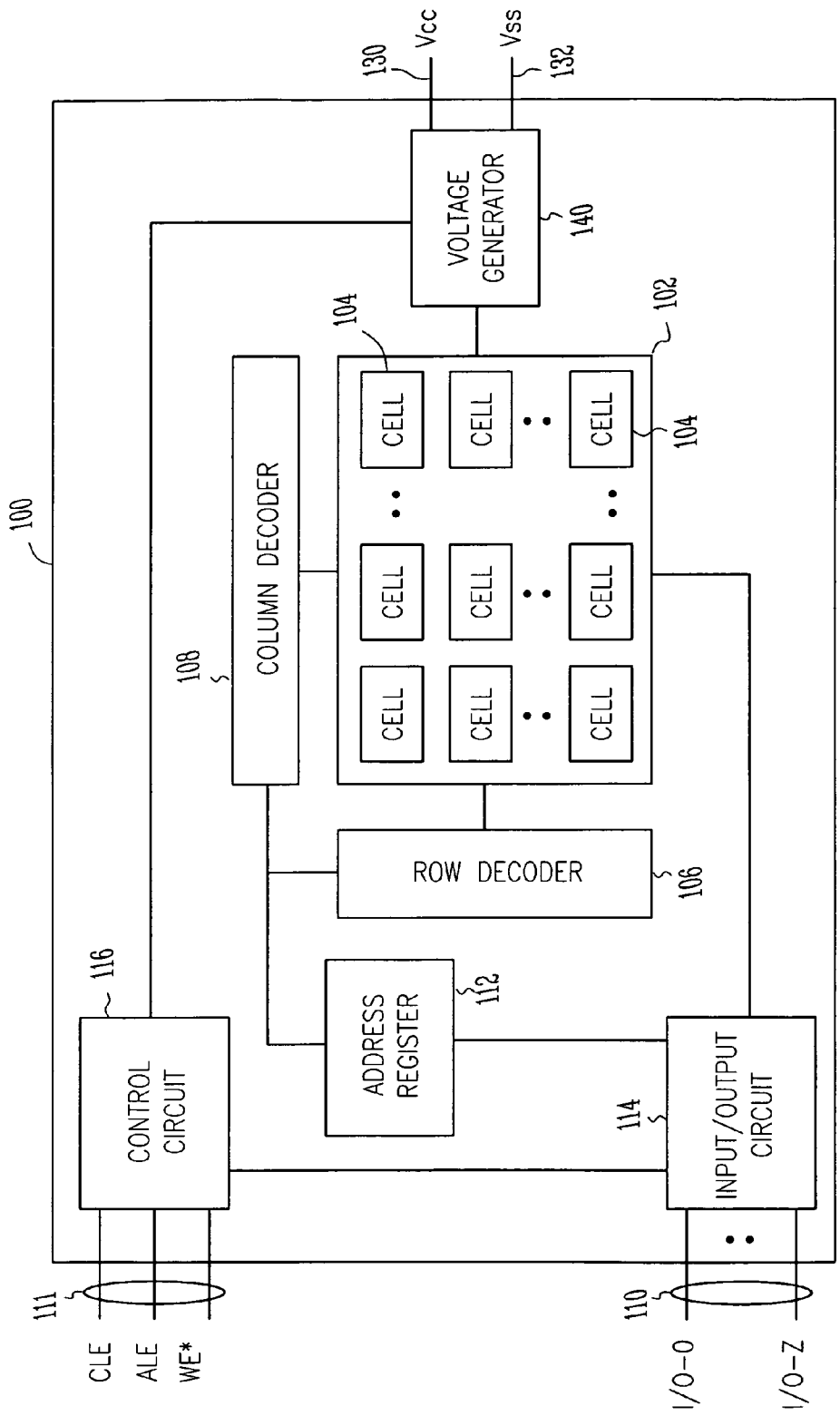
FIG. 1 shows a block diagram of a memory device according to an embodiment of the invention.

FIG. 1 shows a block diagram of a memory device 100 according to an embodiment of the invention. Memory device 100 may include a memory array 102 with memory cells 104 arranged in rows and columns. Row decoder 106 and column decoder 108 may respond to an address register 112, and access memory cells 104 based on row address and column address information on lines 110. A data input/output circuit 114 may transfer data information between memory cells 104 and lines 110. IO-0 through IO-Z on lines 110 may represent information such as operational commands, address, and data. A control circuit 116 may control operations of memory device 100 based on control information on lines 111 such as a command latch signal CLE, an address latch signal ALE, and a write enable signal WE*.

Memory device 100 may include nodes 130 and 132 to receive power or voltages Vcc and Vss. Vcc may be the supply voltage for memory device 100, and Vss may be a ground potential. In some embodiments, Vcc may have a range of about 2.5 volts (v) to about 4v. Memory device 100 may also include a voltage generator 140 to provide different voltages for memory device 100. Control circuitry 116 may include circuitry to perform various operations of memory device 100, such as a programming operation to transfer or write data from lines 110 to memory cells 104, a read operation to transfer or read data from memory cells 104 to lines 110, and an erase operation to erase or clear data from all or a portion of memory cells 104. Memory device 100 may be a flash memory device. In some embodiments, memory device 100 may include a NAND flash memory device, where memory cells 104 may include flash memory cells arrange in a NAND flash memory arrangement.

It will be appreciated by those skilled in the art that additional circuitry and control signals may be provided, and that memory device 100 of FIG. 1 has been simplified to help focus on the embodiments of the invention. It will be understood that the above description of a memory device is intended to provide a general understanding of the memory device and is not a complete description of all the elements and features of a typical memory device. In some embodiments, memory device 100 may include an embodiment of a memory device described with reference to FIG. 2 through FIG. 8.

Figure 2:
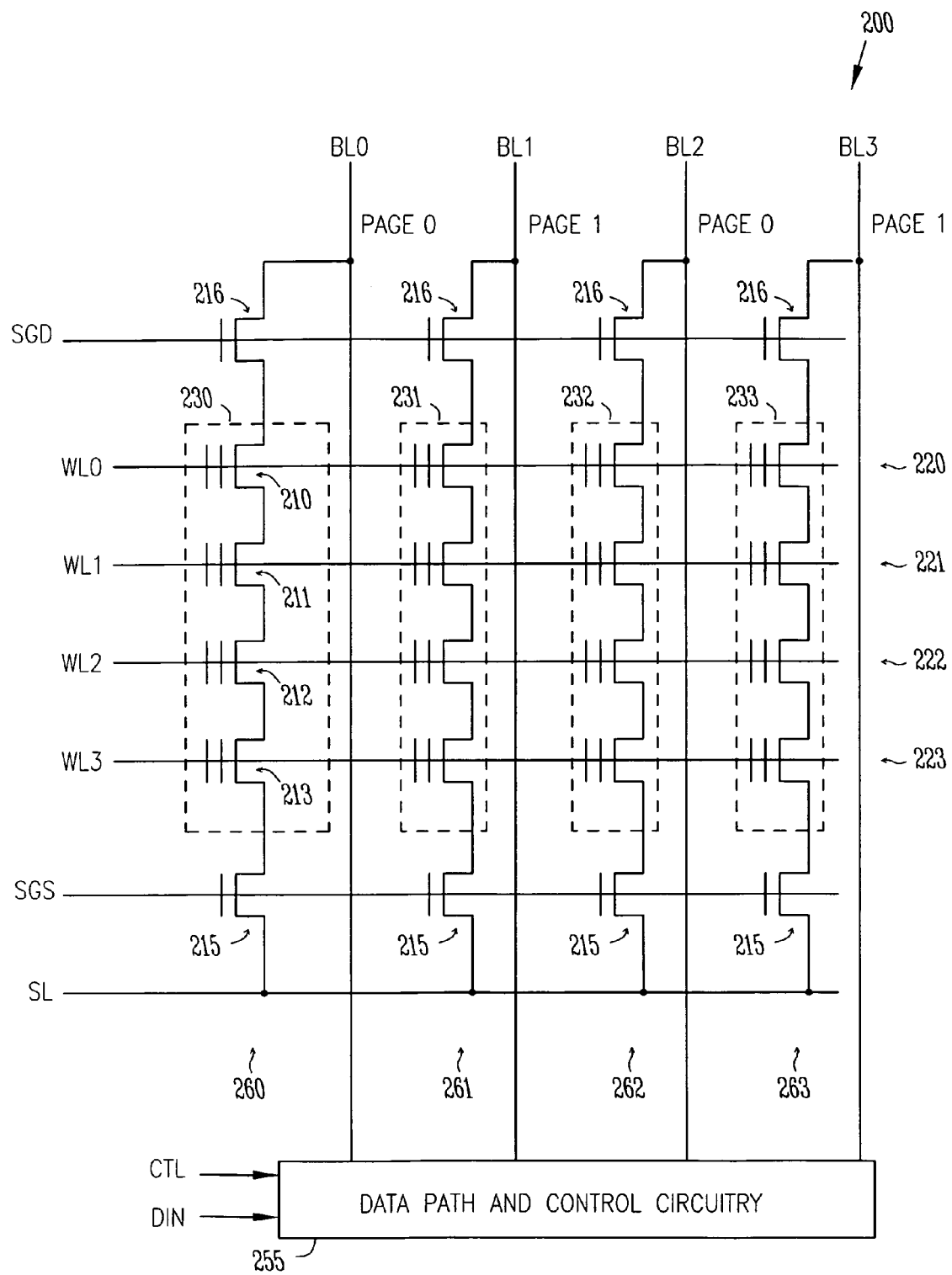
FIG. 2 shows a partial schematic diagram of a memory device according to an embodiment of the invention.

FIG. 2 shows a partial schematic diagram of a memory device 200 according to an embodiment of the invention. Memory device 200 may include an embodiment of memory device 100 of FIG. 1. In FIG. 2, memory device 200 may include a number of memory cells 210, 211, 212, and 213 arranged in addressable rows 220, 221, 222, and 223, and columns 260, 261, 262, and 263. The memory cells in the same column may be connected in series or in a string, such as strings 230, 231, 232, and 233. FIG. 2 shows an example where each string 230, 231, 232, and 233 may include four memory cells 210, 211, 212, and 213. In some embodiments, the number of memory cells in each of strings 230, 231, 232, and 233, the number of strings in each column 260, 261, 262, and 263, or both numbers may vary.

Memory device 200 may also include bit lines BL0, BL1, BL2, and BL3. One of strings 230, 231, 232, and 233 may be coupled to a source line SL via one of transistors 215, and to one of bit lines BL0, BL1, BL2, and BL3 via one of select transistors 216. Select lines SGS and SGD may be used to turn on transistors 215 and 216, respectively. Memory device 200 may include word lines WL0, WL1, WL2, and WL3 to access memory cells 210, 211, 212, and 213. FIG. 2 shows an example where memory device 200 may include four word lines. In some embodiments, the number of the word lines or word lines may vary.

Each of bit lines BL0, BL1, BL2, and BL3 may be a physical conductor to carry information in form of charge during the program, read, or erase operation of memory device 200. To program, read, or erase memory cells 210, 211, 212, and 213, appropriate voltages may be applied to select lines SGS and SGD, source line SL, word lines WL0, WL1, WL2, and WL3, and bit lines BL0, BL1, BL2, and BL3. Data information DIN and control information CTL for the program, read, or erase of memory device 100 may be handled by a data path and control circuitry 255, which may include elements such as latches, multiplexers, voltage sources, and other circuit elements.

In some embodiments, memory cells of memory device 200 may be logically organized into groups or pages such as PAGE 0 and PAGE 1, as shown in FIG. 2. One page may include one group of memory cells and corresponding bit lines. Another page may include another group of memory cells and corresponding bit lines. FIG. 2 shows an example where PAGE 0 may include even bit lines (e.g., BL0 and BL2) and corresponding memory cells in strings 230 and 232, and PAGE 1 may include odd bit lines (e.g., BL1 and BL3) and corresponding memory cells in strings 231 and 233. FIG. 2 shows memory device 200 having two pages as an example. In some embodiments, the number of pages may vary.

During a programming operation of memory device 200, data information DIN may be programmed into the memory cells of one page (e.g. PAGE 0) while the memory cells of the other page (e.g., PAGE 1) may not be programmed or precluded from the programming operation. For example, during a programming operation of memory device 200, the memory cells of strings 230 and 232 (PAGE 0) may be programmed while the memory cells of strings 231 and 233 (PAGE 1) may not be programmed. In another example, during another programming operation of memory device 200, the memory cells of strings 230 and 232 (PAGE 0) may not be programmed while the memory cells of strings 231 and 233 (PAGE 1) may be programmed.

As shown in FIG. 2, bit lines BL0, BL1, dBL2, and BL3 may be located with close proximity of bit line spacing such that, without techniques according to an embodiment of the invention, bit line coupling capacitance during a programming operation may create higher noise in the device. For example, during a programming operation to program data information into the memory cells associated with bit lines BL0 and BL2, the other bit lines BL1 and BL3 may be precharged to a voltage such as Vcc and bit lines BL0 and BL2 may be at ground potential or zero volts (0v). Thus, in this example, the voltages of BL0, BL1, BL2, and BL3 may correspond to 0v, Vcc, 0, and Vcc, respectively. The total capacitance in the bit lines, such as bit lines BL0, BL1, BL2, and BL3, may be equal to the sum of bit line to ground coupling capacitance of the bit lines and bit line-to-bit line coupling capacitance among the bit lines, in which the bit line-to-bit line coupling capacitance may be the majority of the total capacitance. In the example above, since BL0, BL1, BL2, and BL3 may alternately have opposite voltage potentials (e.g., 0v, Vcc, 0, and Vcc), the bit line-to-bit line coupling capacitance may be at its maximum value or relatively high. Thus, the total capacitance in this example may also be at its maximum value or relatively high. Therefore, in this example, the value of the capacitance to be precharged during the programming operation may be relatively high, thereby a relatively higher amount of precharging current may be used during the precharging time. In some cases, the precharging time may be limited to some time interval. Thus, the relatively higher amount of precharging current within some limited precharging time interval may create or increase device noise.

The programming operation of memory device 200, according to an embodiment of the invention, as described below, may reduce device noise because the precharging current may be distributed over the precharging time interval. For example, when memory cells of a selected page (i.e., PAGE 0) are to be programmed, memory device 200 may charge BL0, BL1, BL2, and BL3 (bit lines of both selected and unselected pages) to a voltage while DIN is transferred to bit lines (e.g., BL0 and BL2) of the selected page. In this technique, the capacitance to be precharged may be distributed over the data loading time of DIN, so that bit line precharging peak current may be reduced. As a result, device noise may also be reduced.

Figure 3:
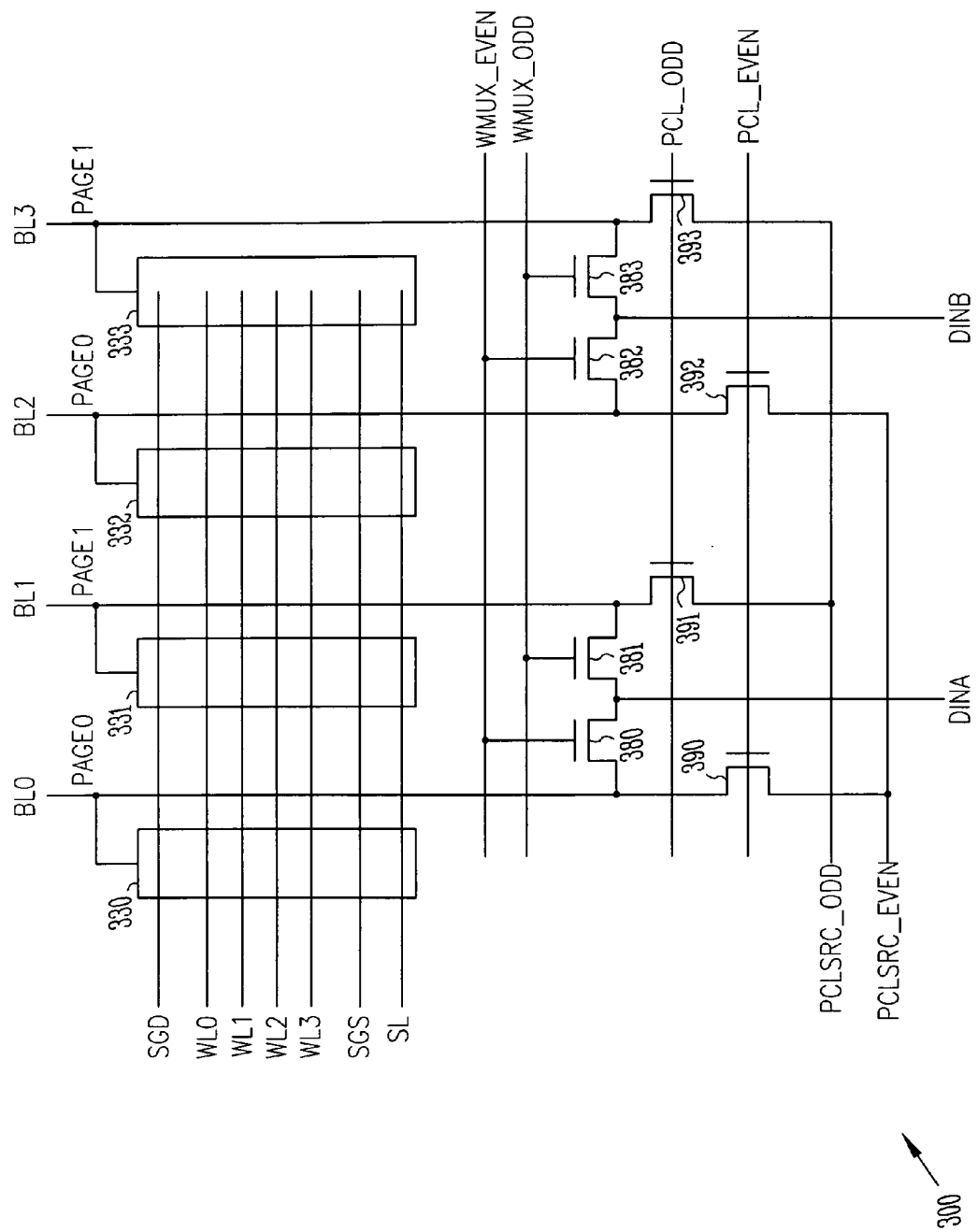
FIG. 3 shows a partial schematic diagram of a portion of a memory device according to an embodiment of the invention.
Figure 5:
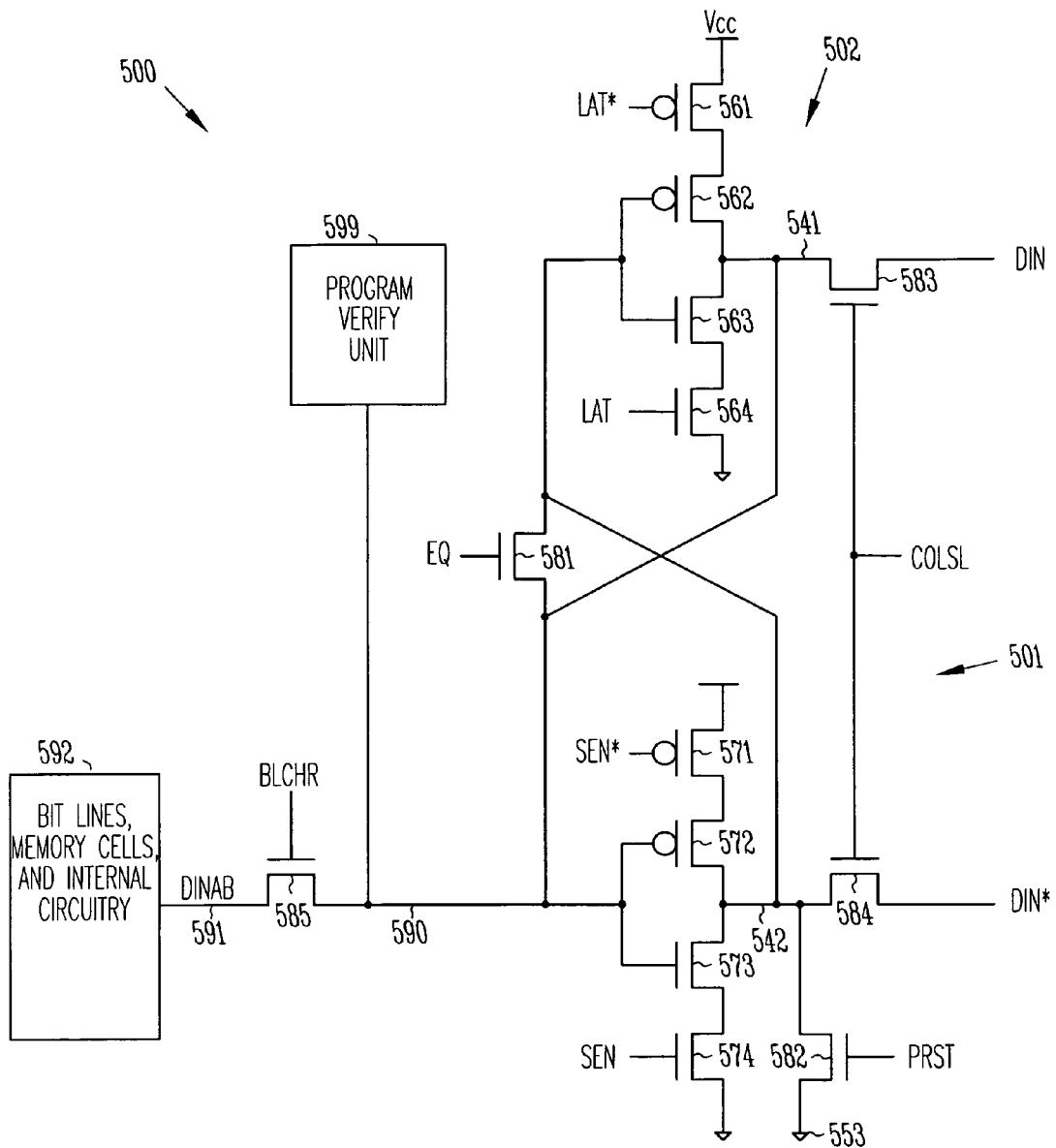
FIG. 5 shows partial schematic diagram of a memory device including a data path according to an embodiment of the invention.

In some embodiments, a programming operation of memory device 200 may be similar or identical to that of the memory devices of FIG. 3 and FIG. 5.

FIG. 3 shows a partial schematic diagram of a portion of a memory device 300 according to an embodiment of the invention. Memory device 300 may include an embodiment of memory device 100 of FIG. 1 or memory device 200 of FIG. 2.

In FIG. 3, memory device 300 may include strings 330, 331, 332, and 333 coupled to corresponding bit lines BL0, BL1, BL2, and BL3. Each of strings 330, 331, 332, and 333 may include memory cells such as memory cells 210, 211, 212, and 213 of FIG. 2. Memory device 300 may be organized into pages, such as PAGE 0 including strings 330 and 332 and bit lines BL0 and BL2, and PAGE 1 including strings 331 and 333 and bit lines BL1 and BL3.

In FIG. 3, SGD, SGS, SL, WL0, WL1, WL2, and WL3 may be similar to those described with reference to FIG. 2. DINA and DINB in FIG. 3 may represent data information to be programmed into the memory cells of strings 330, 331, 332, and 333. The value of each of DINA and DINB may correspond to either a logic one value (binary "1") or a logic zero value (binary "0").

Memory device 300 may also include transistors 380, 382, 390, and 392 that may respond to signals WMUX_EVEN and PCL_EVEN, to either charge bit lines BL0 and BL2 to the voltage potential of PCLSRC_EVEN, or to transfer DINA to bit line BL0 and DINB to bit line BL2. Memory device 300 may further include transistors 381, 383, 391, and 393 that may respond to signals WMUX_ODD and PCL_ODD, to either charge bit lines BL1 and BL3 to the voltage potential of PCLSRC_ODD, or to transfer DINA to bit line BL1 and DINB to bit line BL3.

Figure 4:
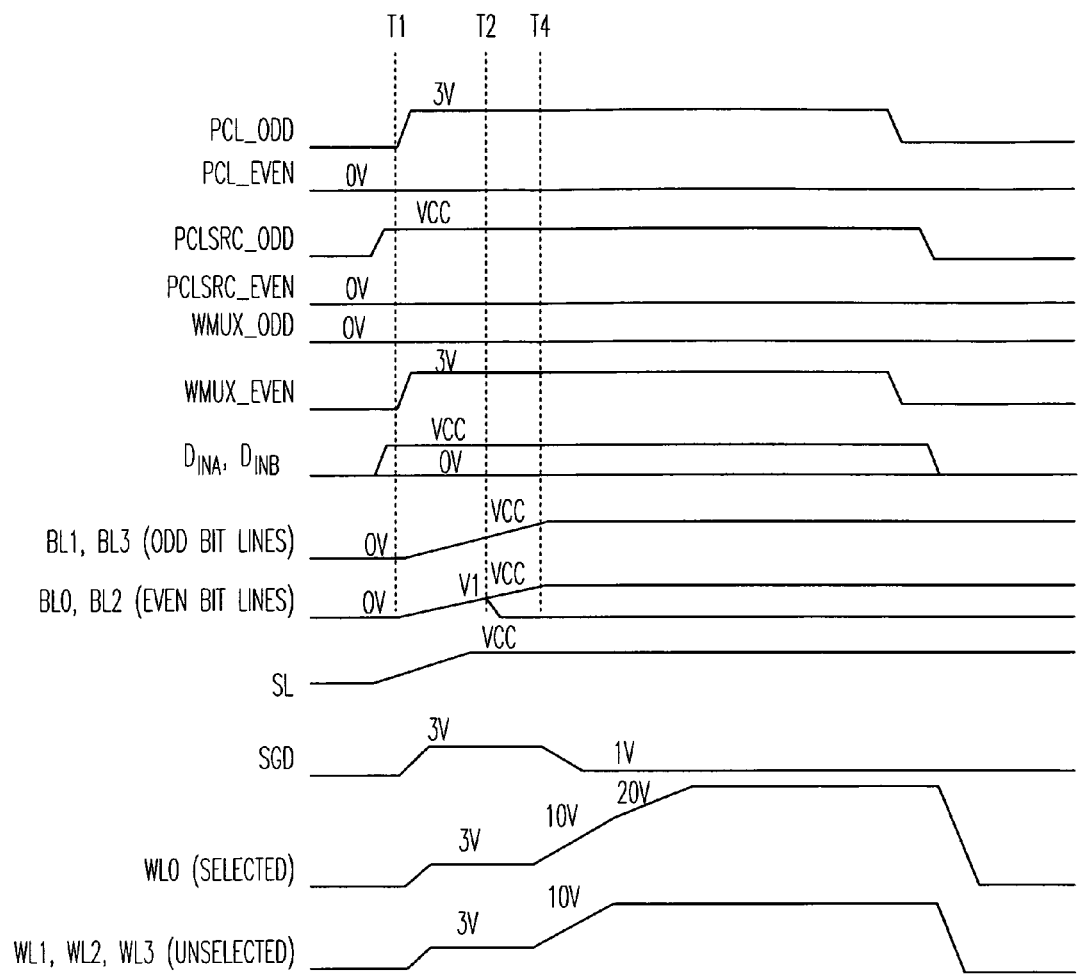
FIG. 4 is an example timing diagram for various signals during a programming operation of the memory device of FIG. 3.

FIG. 4 is an example timing diagram for various signals during a programming operation of memory device 300 of FIG. 3. FIG. 4 shows signals with example voltage values such as 0v (zero volts), 3v, 10v, and 20v. In some embodiments, the voltage values of the signals shown in FIG. 4 may vary.

As shown in FIG. 4, the memory cells that are selected to be programmed may be those associated with WL0 (the selected word line in the example timing diagram of FIG. 4), and the unselected memory cells (those that are not selected to be programmed) may be those associated with WL1, WL2, and WL3 (the unselected word lines in the example timing diagram of FIG. 4).

The following description refers to both FIG. 3 and FIG. 4, in which PAGE 0 may be selected to be programmed and PAGE 1 may not be selected to be programmed.

As shown in FIG. 4, between times T1 and T2, all BL0, BL1, BL2, and BL3 may initially be charged from 0v to an intermediate voltage V1, which may be between 0v and Vcc. BL1 and BL3 may continue to be charged to Vcc from time T2 to T4. In some embodiments, memory device 300 may include an embodiment of the memory device of FIG. 5, such that activities related to charging BL0 and BL2 from 0v to V1 in FIG. 4 may be similar or identical to those described with reference to FIGS. 5 and 6.

In FIG. 4, between times T2 and T4, the charging or discharging of BL0 or BL2 may depend on the value of DINA or DINB. The value at BL0 and BL2, which may represent the data information, may be programmed into selected memory cells of PAGE 0 at a time after time T4. BL1 and BL3 may be maintained at Vcc when data information is programmed into the selected memory cells of PAGE 0.

Between times T1 and T4 of the programming operation, PCL_ODD may be 3v and WMUX_ODD may be 0v. Thus, transistors 381 and 383 may turn off, and transistors 391 and 393 may turn on. Bit lines BL1 and BL3 may be charged from 0v to the voltage potential of PCLSRC_ODD, which may be Vcc.

Also between times T1 and T4, PCL_EVEN may be 0v and WMUX_EVEN may be 3v. Thus, transistors 390 and 392 may be turned off, and transistors 380 and 382 may be turned on, transferring DINA to BL0 and DINB to BL2. Each of DINA and DINB may have a value "1" or "0". If DINA=1, BL0 may continue to be charged from V1 to Vcc. If DINA=0, BL0 may be discharged from V1 to 0v. Similarly, if DINB=1, BL2 may continue to be charged from V1 to at Vcc. If DINB=0, BL2 may be discharged from V1 to 0v.

FIG. 4 shows an example where BL0 or BL2 may initially be charged to V1, then discharged from V1 to 0v if DINA=0 or DINB=0. In some embodiments, BL0 or BL2 may initially be charged to Vcc (instead of V1), then discharged from Vcc to 0v if DINA=0 or DINB=0.

In the programming operation in memory device 300, charging the bit lines (BL0 and BL2) of the selected page (e.g. PAGE 0) and charging the bit lines (BL1 and BL3) of the unselected page (e.g. PAGE 1) while data information is transferred to the bit lines of the selected page, as described above, may reduce coupling capacitance between adjacent bit lines of memory device 300 (e.g., between bit lines BL0 and BL1, between bit lines BL1 and BL2, and between bit lines BL2 and BL3). Therefore, device performance may be improved.

FIG. 5 shows a partial schematic diagram of a memory device 500 including a data path 501 according to an embodiment of the invention. In FIG. 5, memory device 500 is simplified to focus on the description described herein. Memory device 500 may include an embodiment of memory device 100, 200, 300 of FIG. 1, FIG. 2, or FIG. 3.

In FIG. 5, DIN and DIN* may be complementary signals. DIN may represent information such as one of I/O-0 through I/O-Z of memory device 100 of FIG. 1. In FIG. 5, DINAB may correspond to one of DINA and DINB of FIG. 3.

Memory device 500 may include a latch 502 having one inverter formed by transistors 561, 562, 563, and 564, and another inverter formed by transistors 571, 572, 573, and 574. Memory device 500 may further include transistors 581, 582, 583, 584, and 585. Transistors 581 and 582 may respond to signals EQ and PRST, respectively, to reset latch 502 before DIN is received. Transistors 583 and 584 may respond to a signal COLSL to transfer DIN to latch 502 after latch 502 is reset. Transistor 585 may respond to a signal BLCHR to transfer information from node 590 to node 591 such that a bit line coupled to node 591 may be charged (or discharged) during a data information loading time of memory device 500. The charging and discharging of the bit lines of memory device 500 is discussed in detail below in connection with FIG. 6. In FIG. 5, circuitry in block 592 may include the bit lines, associated memory cells, and other internal circuitry of memory device 500. Memory device 500 may include a program verify unit 599 to verify whether DIN is properly programmed into the memory cells of memory device 500. The description herein omits the description of a programming verify operation, which may be performed by methods known to those skilled in the art.

FIG. 5 shows a simplified memory device 500 with only one latch 502 in data path 501. Memory device 500, however, may include a number of latches similar or identical to latch 502 to receive data information. The number of latches of memory device 500 may be equal to the number of components such as I/O-0 through I/O-Z of FIG. 1.

Figure 6:
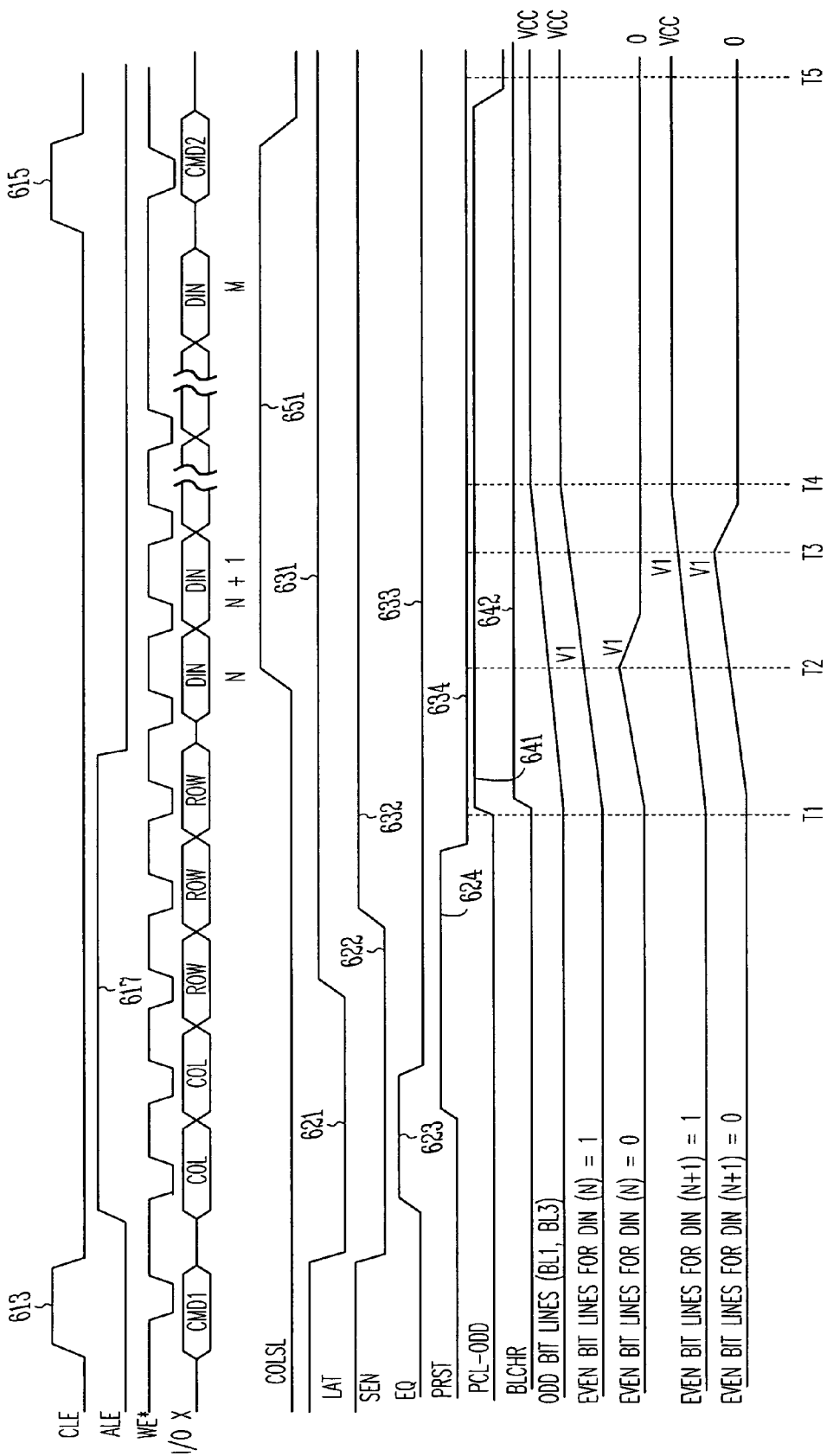
FIG. 6 is an example timing diagram for various signals in a programming operation of the memory device of FIG. 5.

FIG. 6 is an example timing diagram for various signals during a programming operation of memory device 500 of FIG. 5. The following description refers to both FIG. 5 and FIG. 6.

In FIG. 6, the I/Ox may be similar to I/O-0 to I/O-Z on lines 110 of FIG. 1. In FIG. 6, information such as operational commands, address, and data may be provided through I/Ox. As shown in FIG. 6, commands CMD1 and CMD2 may be issued to memory device 500 when CLE has high signal levels 613 and 615. CMD1 may indicate a start of a programming operation. Following CMD1, information such as column address (Col), row address (Row), and data information DIN may be loaded or inputted. CMD2 may be issued after completion of the loading or input of information, including data information DIN. Thus, as shown in FIG. 6, the time interval between CMD1 and CMD2 may indicate a loading or input time interval. In a programming operation, following CMD2, memory device 500 may program or write DIN (received between CMD1 and CMD2) into memory cells that are associated with the column address (Col) and row address (Row) received between CMD1 and CMD2.

As shown in FIG. 6, the information received or loaded via I/Ox may be based on the timing or signal levels of the CLE, ALE, and WE* signals. Address information including column address (Col) and row address (Row) may be received during the time when the ALE signal has a high signal level 617. Data information DIN (N), DIN (N+1), and DIN (M) may be received following the address information. Each of DIN (N), DIN (N+1), and DIN (M) may include multiple bits (e.g., a byte).

In FIG. 5, before DIN and DIN* are transferred to nodes 541 and 542, latch 502 may be reset. LAT and LAT* may be complementary signals. Transistors 561, 562, 563, and 564 may operate as an inverter when LAT has a high signal level and LAT* has a low signal level. Similarly, signals SEN and SEN* may be complementary signals. Transistors 571, 572, 573, and 574 may operate as an inverter when SEN has a high signal level and SEN* has a low signal level. The reset of latch 502 may occur when LAT and SEN have low signal levels 621 and 622 (FIG. 6), EQ has a high signal level 623, and PRST has a high signal level 624. When latch 502 is reset, the voltage potential at nodes 541 and 542 may be held at the voltage potential at node 553 (or ground potential) by transistor 582, which may be turned on by the PRST signal being high. Latch 502 may be released from the reset when LAT and SEN have high signal levels 631 and 632, EQ has a low signal level at 633, and PRST has a low signal level 634. At time T1, when latch 502 may be released from the reset, the voltage potential at node 542 may be Vcc minus the threshold voltage of each of transistor 561 and 562. In some embodiments, the voltage potential at node 542 at time T1 may be about ½ Vcc.

FIG. 6 shows an example timing diagram for memory device 500 when DIN may be programmed into memory cells of an even page (e.g., PAGE 0) or the memory cells associated with even bit lines of memory device 500. The memory cells of an odd page (e.g., PAGE 1) or the memory cells associated with odd bit lines of memory device 500 may not be programmed.

Thus, in the example of FIG. 6, DIN may be transferred to the even bit lines while the odd bit lines may be charged to a voltage such as Vcc, as described in details below.

At time T1, memory device 500 may activate PCL_ODD to a high signal level 641 to charge odd bit lines of memory device 500 to a voltage such as PCLSRC_ODD (FIG. 3), which may be Vcc. As shown in FIG. 6, between times T1 and T4, the odd bit lines may be charged to Vcc. In some embodiments, the odd bit lines may be charged to a voltage different from Vcc.

Also at time T1, after latch 502 is released from the reset, BLCHR may be activated to a high signal level 642. Thus, the voltage potential at node 591 may be the voltage at node 590, which is also the voltage at node 541. Since the memory cells associated with the even bit lines are to be programmed in this example, memory device 500 may couple node 590 to an even bit line. For example, memory device 500 may activate a signal (e.g., WMUX_EVEN of FIG. 3) to turn on transistors (e.g., transistors 380 and 382) so that node 591 may be coupled to an even bit line (e.g., BL0 or BL2). FIG. 6 shows that between times T1 and T2, the even bit lines associated with DIN (N) are charged to an intermediate voltage V1. Between times T1 and T3, the even bit lines associated with DIN (N+1) are also charged to V1. As shown in FIG. 6, V1 may be between 0volts and Vcc. FIG. 6 shows an example where the even bit lines may be charged to the same voltage V1 among each other. In some embodiments, the different even bit lines may be charged to different voltages.

Thus, while the odd bit lines may be charged to Vcc between times T1 and T4 during a programming operation, the even bit lines associated with DIN (N) may be charged to V1 (between times T1 and T2), and the even bit lines associated with DIN (N+1) may be also be charged to V1.

At time T2, COLSL may be activated to a signal level 651 such that DIN and DIN* may be transferred to nodes 541 and 542, respectively. DIN may be transferred from node 541 to node 591, then DIN may be transferred to the corresponding even bit line based on the column and address information.

As mentioned above, each of DIN (N), DIN (N+1), and DIN (M) may include multiple bits (e.g., a byte). Thus, each of DIN (N), DIN (N+1), and DIN (M) in FIG. 6 may include multiple bits with different values, i.e., "0" and "1". FIG. 6 shows the voltage levels of the even bit lines that may receive DIN (N) where DIN (N) may be "0", and the voltage levels of the voltage levels of even bit lines that may receive DIN (N) where DIN (N) may be "1". Similarly, FIG. 6 shows the voltage levels of the even bit lines that may receive DIN (N+1) where DIN (N+1) may be "0", and the voltage levels of the even bit lines that may receive DIN(N+1) where DIN(N+1) maybe "1". The voltage levels of other DIN such as DIN (M) may follow a pattern similar to those of the voltage levels of DIN (N) and DIN (N+1).

As shown in FIG. 6, before time T1 when DIN (N) is not received, the even bit lines may be charged to V1 (e.g., the voltage at node 541).

When DIN (N) is received and if it has value "1", i.e., DIN (N)=1, the even bit lines that receive DIN (N)=1 may continue to be charged to reflect the value "1" of DIN (N). As shown in FIG. 6, the even bit lines that receive DIN (N)=1 may continue to be charged from V1 to a voltage, e.g., Vcc.

When DIN (N) is received and if it has value "0", i.e., DIN (N)=0, the charging of the even bit lines that receive DIN (N)=0 may be discontinued and the voltage of these even bit lines may decrease from V1 to reflect the value "0" of DIN (N). As shown in FIG. 6, at time T2, the even bit lines that receive DIN (N)=0 may be discharged from V1 to a lower voltage, e.g., ground potential.

The following description describes the activity of memory device 500 between times T1 and T5 for DIN (N)=1 and DIN (N)=0. For DIN (N+1)=1 and DIN (N+1)=0, memory device 500 operates in a similar fashion.

The activity of memory device 500 between times T1 and T5 for DIN (N)=1 is described as follows. In FIG. 5, before DIN is received at node 541, the even bit lines that receive DIN (N)=1 may be charged to the voltage at node 591 (for example, V1, which may be ½Vcc). When DIN=1 is received at node 541, the voltage at node 541 may rise to a higher voltage, e.g., Vcc. Since node 591 is coupled to node 541, the voltage at node 591 may also rise. Thus, the charge or voltage of the even bit line coupled to node 591 may also rise. As shown in FIG. 6, at time T2, the even bit lines that receive DIN (N)=1 may continue to be charged from V1 and may reach Vcc at time T4. DIN (N)=1 at the even bit lines may then be programmed to corresponding memory cells at time T5 after CMD2 is issued.

The activity of memory device 500 between times T1 and T5 for DIN (N)=0 is described as follows. In FIG. 5, before DIN is received at node 541, the even bit lines that receive DIN (N)=0 may be charged to the voltage at node 591 (for example, V1, which may be ½Vcc). When DIN=0 is received at node 541, the voltage at node 541 may fall to a lower voltage, e.g., 0 volts. Since node 591 is coupled to node 541, the voltage at node 591 may also fall. Thus, voltage of the even bit line coupled to node 591 may also fall. As shown in FIG. 6, at time T2, the voltage of the even bit lines that receive DIN (N)=0 may fall from V1 and may reach a ground potential at a time after time T2. DIN (N)=0 at the even bit lines may then be programmed to corresponding memory cells at time T5 after CMD2 is issued.

Thus, as described above with reference to FIG. 5 and FIG. 6, memory device 500 may charge bit lines of a first page of a flash memory device and may perform a programming operation on the first page while the bit lines of the second page are being charged to the first voltage, e.g., Vcc. The programming operation may include transferring data information to the bit lines of the first page while the bit lines of the second page are being charged to the first voltage. The programming operation may also include programming the data information from the bit lines of the first page into memory cells of the first page while the bit lines of the second page may be maintained at the first voltage.

Figure 7:
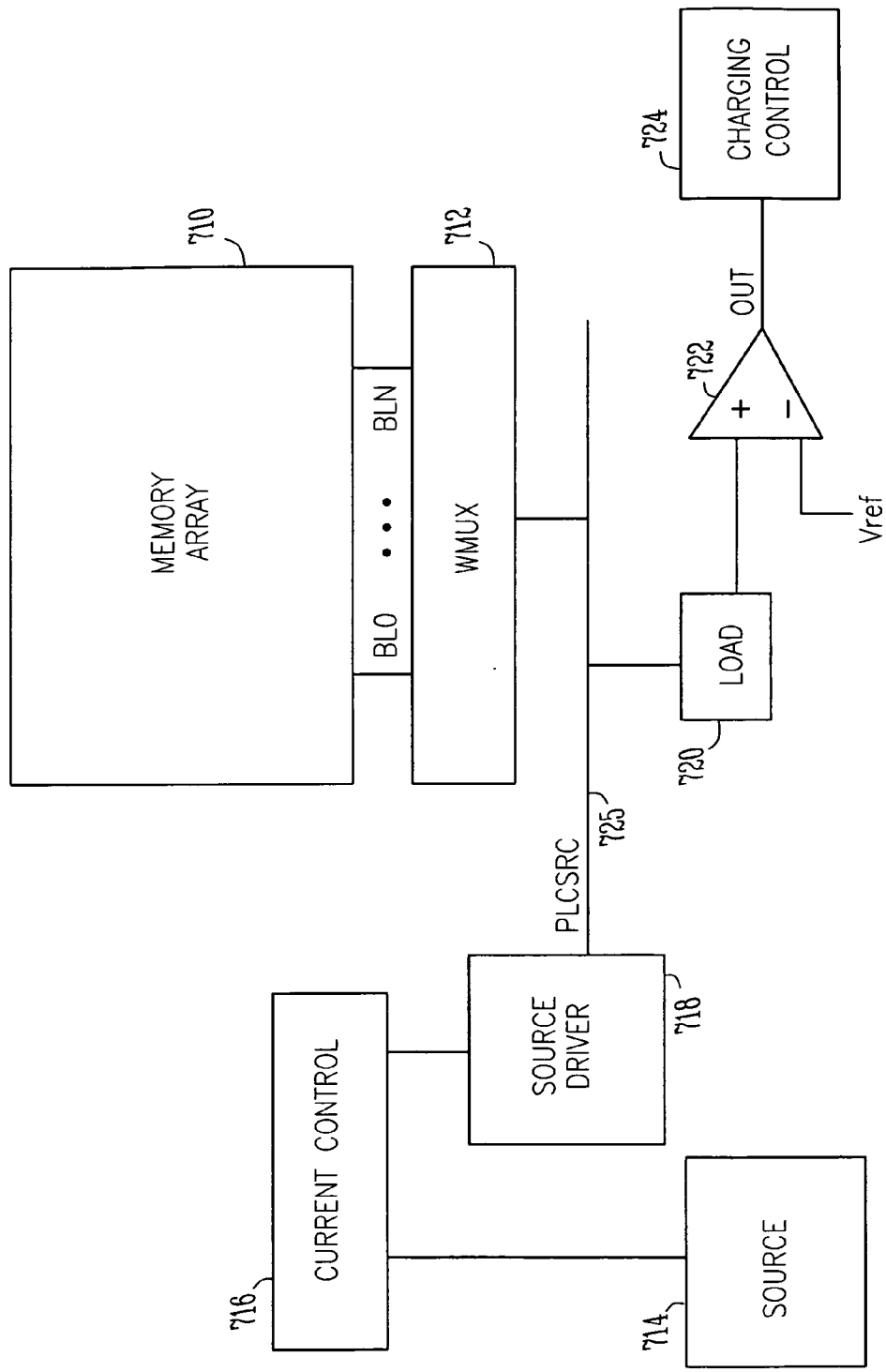
FIG. 7 shows partial schematic diagram of a memory device including charging control according to an embodiment of the invention.

FIG. 7 shows a partial schematic diagram of a memory device 700 including charging control 724 according to an embodiment of the invention. Memory device 700 may include an embodiment of memory device 100, 200, 300, or 500 described in connection with FIG. 1 through FIG. 6.

In FIG. 7, memory device 700 may include a memory array 710 to store information, a select circuit (WMUX) 712 to access memory array 710, and a source driver 718 to drive a voltage signal PLCSRC on a line 725 based on a source 714 and a current control 716 during a programming operation of memory device 700. PLCSRC may be coupled to BL0 through BLN during precharging of BL0 through BLN in a programming operation. Current control 716 may include a current mirror to limit current during precharging of bit lines BL0 through BLN such that bit line precharging time may be varied to improve programming time of the program operation. PLCSRC on line 725 may be measured by combination of a load 720, which may provide a measured voltage based on PLCSRC, and a comparator 722, which may compare the measured voltage with a reference voltage Vref. A charging control 724 may respond to a signal OUT at the output of comparator 722 to control the charging of bit lines BL0 through BLN. For example, charging control 724 may end the precharging when OUT has a high signal level. In memory device 700, overall programming operation time may be improved with a relatively lower peak precharging current.

Figure 8:
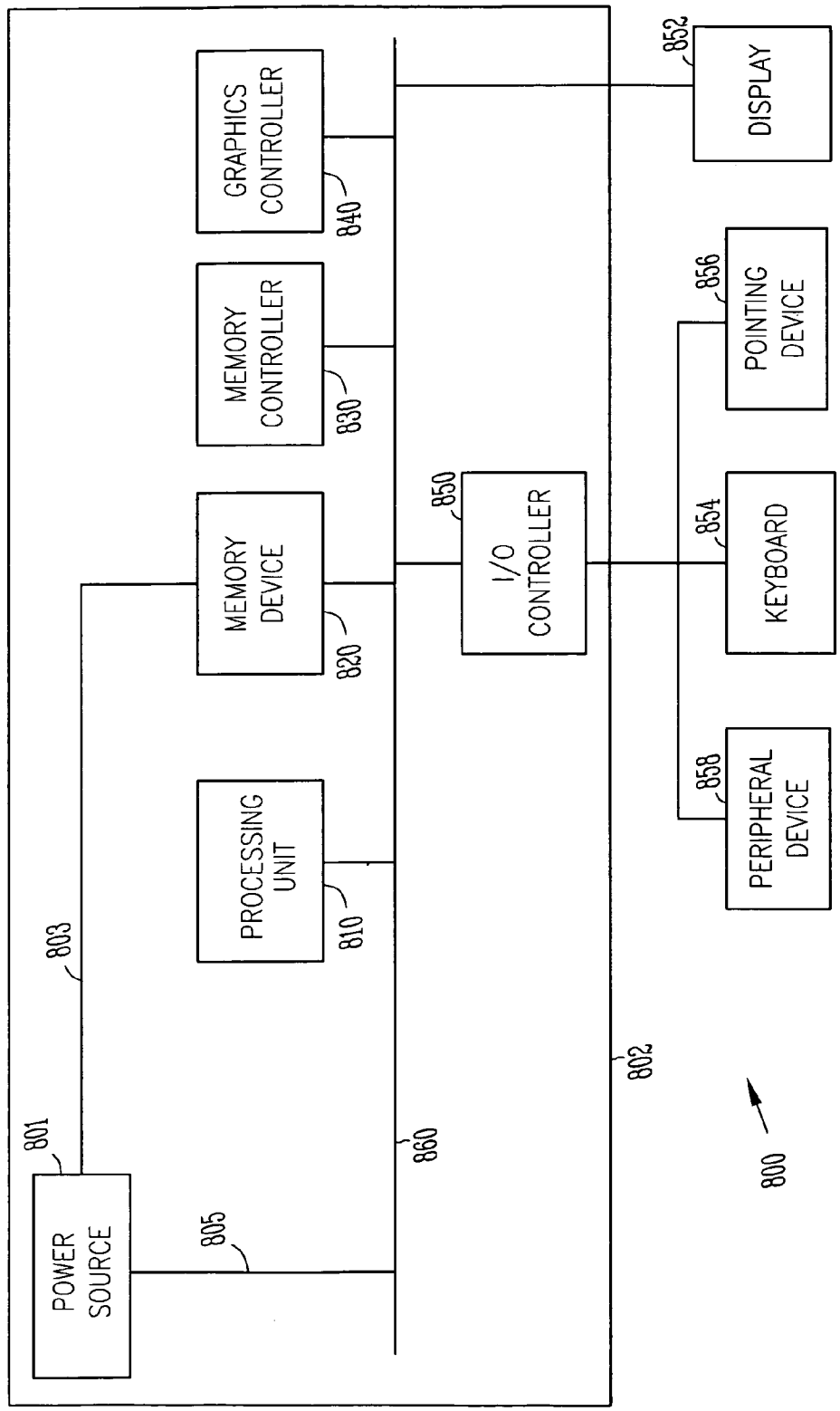
FIG. 8 shows a block diagram of a system according an embodiment of the invention.

FIG. 8 shows a block diagram of a system 800 according to an embodiment of the invention. System 800 may include a processing unit 810, a memory device 820, a memory controller 830, a graphics controller 840, an input and output (I/O) controller 850, a display 852, a keyboard 854, a pointing device 856, a peripheral device 858, and a bus 860. System 800 may also include a circuit board 802 on which some components of system 800 may be located, as shown in FIG. 8. Circuit board 802 may include terminals 803 and 805 coupled to a power source 801 to provide power or voltage to the components of system 800 including memory device 820. Power source 801 may be provided by alternating current to direct current (AC to DC) converting circuitry, a battery, or others. Memory device 820 may be a volatile memory device, a non-volatile memory device, or a combination of both. For example, memory device 820 may be a dynamic random access memory (DRAM) device, a static random access memory (SRAM) device, a flash memory device, or a combination of these memory devices. I/O controller 850 may include a communication module for wired or wireless communication. In some embodiments, the number of components of system 800 may vary.

Processing unit 810 may process information transferred to and from other components via bus 860. Processing unit 810 may include a general-purpose processor or an application specific integrated circuit (ASIC). Processing unit 810 may be a single core processing unit or a multiple-core processing unit.

In some embodiments, memory device 820 may include an embodiment of memory devices 100, 200, 300, 500, and 700 described above with reference to FIG. 1 through FIG. 7.

System 800 may include computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   charging first bit lines of a first page of a flash memory device including charging a selected bit line of the first bit lines;
   charging second bit lines of a second page of the flash memory device to a first voltage; and
   performing a programming operation on the first page while the second bit lines are being charged to the first voltage, wherein performing the programming operation includes discontinue charging the selected bit line before the second bit lines reach the first voltage when data information to be programmed into a memory cell of the flash memory device associated with the selected bit line has a selected value among a first value and a second value.

2. The method of claim 1, wherein performing the programming operation includes transferring data information to the first bit lines while the second bit lines are being charged to the first voltage.

3. The method of claim 2, wherein performing the programming operation includes:
   activating a word line to access a row of memory cells of the first page; and
   transferring the data information into memory cells associated with the word line and the first bit lines of the first page.

4. The method of claim 3, wherein transferring the data information is performed after the second bit lines reach the first voltage.

5. The method of claim 2, wherein performing the programming operation includes reducing a voltage of the first bit lines from an intermediate voltage to a ground potential after the data information is transferred to the first bit lines, and wherein the intermediate voltage is lower than the first voltage.

6. The method of claim 2, wherein transferring the data information to the first bit lines includes:
   transferring the data information to the selected bit line, wherein selected value is the first value; and
   continuing to charge the selected bit line to a voltage equal to the first voltage when the data information has the second value.

7. The method of claim 6, wherein the first voltage includes a supply voltage of the flash memory device.

8. The method of claim 7, wherein discontinue charging the selected bit line includes reducing a voltage of the first bit lines to a ground potential.

9. The method of claim 1, further comprising comparing a voltage of a bit line of one of the first and second pages while the second bit lines are being charged to the first voltage.

10. A method comprising:
    charging first bit lines of a first page of a flash memory device;
    charging second bit lines of a second page of the flash memory device to a first voltage, the first voltage including a supply voltage of the flash memory device;
    performing a programming operation on the first page while the second bit lines are being charged to the first voltage, wherein performing the programming operation includes transferring data information to the first bit lines while the second bit lines are being charged to the first voltage, wherein transferring includes transferring the data information to a selected bit line of the first bit lines, continuing to charge the selected bit line to a voltage equal to the first voltage when the data information has a first value, and discontinuing charging of the selected bit line when the data information has a second value, and wherein discontinuing includes reducing a voltage of the first bit lines to a ground potential; and
    ending the charging of the first bit lines and the second bit lines when the voltage of the bit lines of one of the first and second pages exceeds a reference voltage.

11. An apparatus comprising:
    a circuit to receive data information;

a memory array, including a plurality of first memory cells, and a first bit line and a second bit line coupled to the circuit and to the plurality of first memory cells; and control circuitry to charge the first bit line and the second while the data information is received at the circuit, and to program the data information into a selected memory cell of the plurality of first memory cells after the data information is received at the circuit, wherein the control circuitry is to discontinue charging the first bit line before the second bit line reaches a voltage and continue charging the second bit line to the voltage when data information to be programmed into the selected memory cell has a selected value among a first value and a second value.

12. The apparatus of claim 11, wherein the memory array further includes a plurality of second memory cells coupled to the circuit and to the second bit line, wherein the control circuitry is to continue to charge the second bit line while the data information is received at the circuit, and wherein the control circuitry is to preclude programming the plurality of second memory cells while the data information is programmed into the selected memory cell.

13. The apparatus of claim 12, wherein the memory array further includes a plurality of third memory cells, and a third bit line coupled to the circuit and to the plurality of third memory cells, wherein the first, second, and third bit lines are three consecutive bit lines, with the first bit line being between the second and third bit lines, wherein the control circuitry is to charge the third bit line while the data information is received at the circuit, and wherein the control circuitry is to preclude programming the plurality of third memory cells while the data information is programmed into the selected memory cell.

14. The apparatus of claim 13, wherein the control circuitry is to maintain the second and third bit lines at the voltage while the data information is programmed into the selected memory cell.

15. The apparatus of claim 11, wherein the circuit includes a latch having a node to receive the data information, and wherein the control circuitry is to charge the first bit line to a voltage potential at the node before the data information is received at the node.

16. The apparatus of claim 11, wherein the circuit includes:
a first inverter having a first input node to receive the data information, and a first output node;
a second inverter having a second input node coupled to the first output node, and a second output node coupled the first input node.

17. An apparatus comprising:
a circuit to receive data information;
a memory array, including a plurality of first memory cells, and a first bit line coupled to the circuit and to the plurality of first memory cells;

control circuitry to charge the first bit line while the data information is received at the circuit, and to program the data information into a selected memory cell of the plurality of first memory cells after the data information is received at the circuit; and a second circuit to end charging of the first bit line based on a comparison between a voltage of the first bit line and a reference voltage.

18. A system comprising:
a flash memory device including,
a circuit to receive data information;
a memory array, including a plurality of first memory cells and a first bit line coupled to the circuit and to the plurality of first memory cells; and
control circuitry to charge the first bit line and a second bit line while the data information is received at the circuit, and to program the data information into a selected memory cell of the plurality of first memory cells after the data information is received at the circuit, wherein the control circuitry is to discontinue charging the first bit line before the second bit line reaches a voltage and continue charging the second bit line to the voltage when data information to be programmed into the selected memory cell has a selected value among a first value and a second value; and
a circuit board coupled to the flash memory device, the circuit board including a terminal to couple to a battery to provide power to the flash memory device.

19. The system of claim 18, wherein the memory array further includes a plurality of second memory cells coupled to the circuit and to the second bit line, wherein the control circuitry is to continue to charge the second bit line while the data information is received at the circuit, and wherein the control circuitry is to preclude programming the plurality of second memory cells while the data information is programmed into the selected memory cell.

20. The system of claim 19, wherein the memory array further includes a plurality of third memory cells and a third bit line coupled to the circuit and to the plurality of third memory cells, wherein the first, second, and third bit lines are three consecutive bit lines, with the first bit line being between the second and third bit lines, wherein the control circuitry is to charge the third bit line while the data information is received at the circuit, and wherein the control circuitry is to preclude programming the plurality of third memory cells while the data information is programmed into the selected memory cell.

21. The method of claim 1, wherein the selected value is the first value, and wherein performing the programming operation includes continuing charging the selected bit line when the data information to be programmed into the memory cell has the second value.

* * * * *